(12) United States Patent
Ryu et al.

(10) Patent No.: US 8,039,120 B2
(45) Date of Patent: Oct. 18, 2011

(54) ORGANIC ELECTROLUMINESCENCE DEVICE AND METHOD OF MANUFACTURING THE SAME

(75) Inventors: Seoung-Yoon Ryu, Suwon-si (KR); Kwan-Hee Lee, Suwon-si (KR); Ja-Hyun Im, Suwon-si (KR); Jang-Hyuk Kwon, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1036 days.

(21) Appl. No.: 11/362,864

(22) Filed: Feb. 28, 2006

(65) Prior Publication Data

US 2007/0001586 A1 Jan. 4, 2007

(30) Foreign Application Priority Data

Mar. 7, 2005 (KR) .................. 10-2005-0018829

(51) Int. Cl.
*H01L 51/50* (2006.01)
*B05D 5/12* (2006.01)

(52) U.S. Cl. ........ 428/690; 428/917; 313/504; 313/506; 427/66

(58) Field of Classification Search .................. None
See application file for complete search history.

(56) References Cited

U.S. PATENT DOCUMENTS

| | | | |
|---|---|---|---|
| 4,885,211 A | 12/1989 | Tang et al. | |
| 6,030,700 A | 2/2000 | Forrest et al. | |
| 6,075,316 A | 6/2000 | Shi et al. | |
| 6,548,956 B2 | 4/2003 | Forrest et al. | |
| 6,596,134 B2 | 7/2003 | Forrest et al. | |
| 7,097,917 B1* | 8/2006 | Fujita et al. | 428/690 |
| 7,157,852 B2* | 1/2007 | Lee | 313/506 |
| 2001/0043046 A1* | 11/2001 | Fukunaga | 315/160 |
| 2002/0024096 A1* | 2/2002 | Yamazaki et al. | 257/359 |
| 2002/0036297 A1* | 3/2002 | Pichler | 257/103 |
| 2003/0227250 A1 | 12/2003 | Nee | |
| 2004/0021415 A1 | 2/2004 | Vong et al. | |
| 2004/0245918 A1* | 12/2004 | Lee | 313/503 |

FOREIGN PATENT DOCUMENTS

| | | |
|---|---|---|
| CN | 2283311 | 6/1998 |
| EP | 0278757 | 11/1997 |
| EP | 1154676 | 11/2001 |
| JP | 10177896 | 6/1998 |
| JP | 2004095491 | 3/2004 |
| JP | 2004228081 | 8/2004 |
| JP | 2004238645 | 8/2004 |
| JP | 2004253390 | 9/2004 |
| JP | 2004-303481 | 10/2004 |
| JP | 2004319143 | 11/2004 |

(Continued)

OTHER PUBLICATIONS

Translation of description portion of JP 2004-303481, published Oct. 2004.*

(Continued)

*Primary Examiner* — Dawn Garrett

(74) *Attorney, Agent, or Firm* — H.C. Park & Associates, PLC

(57) ABSTRACT

An organic electroluminescence device, and a method of manufacturing the same, where the device includes a substrate, a first electrode formed on the substrate, an organic layer formed on the first electrode and including at least an organic light-emitting layer, and a second electrode formed on the organic layer. The second electrode is made of an Mg—Ag layer having a thickness in a range of 170 Å to 200 Å.

26 Claims, 6 Drawing Sheets

FOREIGN PATENT DOCUMENTS

| | | |
|---|---|---|
| JP | 2005032563 | 2/2005 |
| JP | 2005038833 | 2/2005 |
| JP | 2005038849 | 2/2005 |
| KR | 10-2004-0085010 | 10/2004 |

OTHER PUBLICATIONS

B.J. Chen, X.W. Sun, S.C. Tan; "Transparent Organic Light-Emitting Devices with LiF/Mg:Ag cathode" Optics Express, vol. 13, No. 3; Feb. 7, 2005, pp. 937-941, XP002385529, Opt. Soc. of America.

T. Sakai et al.; "Organic EL Materials Based on Styryl and Amine Derivatives", Journal of the Society for Information Display, vol. 10/2, Jun. 1, 2002, pp. 145-149, XP002385530, SID, USA.

P.E. Burrows et al.; "Semitransparent Cathodes for Organic Light Emitting Devices" Journal of Applied Physics, vol. 87, No. 6, Mar. 15, 2000, pp. 3080-3085, XP002385531, AIP, USA.

Chinese Office Action dated Sep. 26, 2008.

* cited by examiner

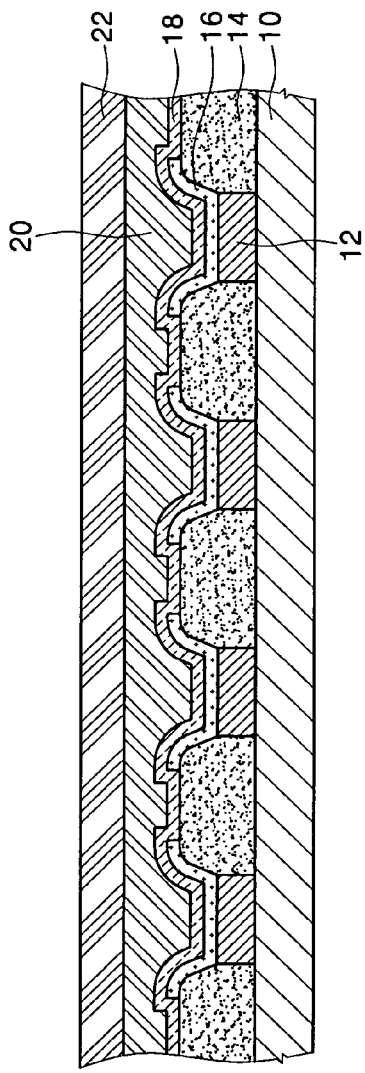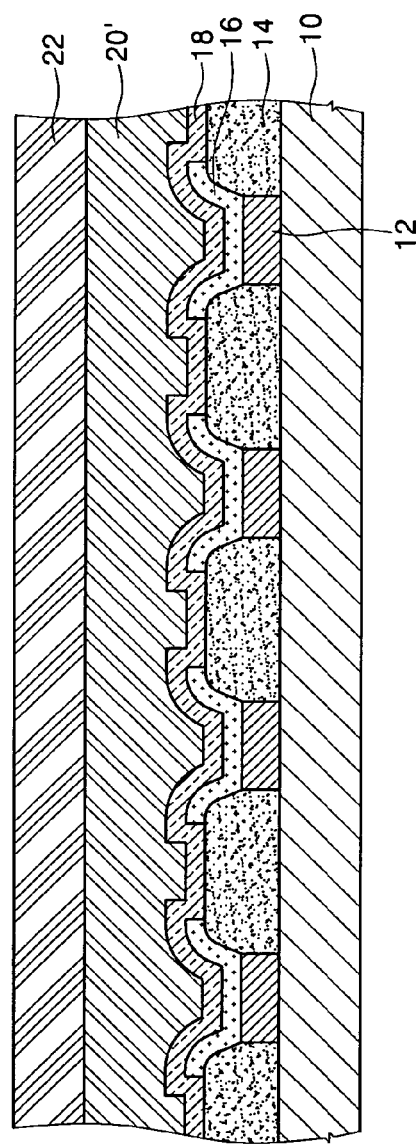

ORGANIC ELECTROLUMINESCENCE DEVICE AND METHOD OF MANUFACTURING THE SAME

CROSS REFERENCE TO RELATED APPLICATION

This application claims priority to and the benefit of Korean Patent Application No. 2005-18829, filed on Mar. 7, 2005, which is hereby incorporated by reference for all purposes as if fully set forth herein.

BACKGROUND OF THE INVENTION

1. Field of the Invention

The present invention relates to an organic electroluminescence device and a method of manufacturing an organic electroluminescence device, and more particularly to an organic electroluminescence device using an Mg—Ag layer as a cathode electrode ("cathode") and a method of manufacturing the organic electroluminescence device.

2. Discussion of the Background

Generally, an organic electroluminescence device includes organic light-emitting layers between an anode electrode ("anode") and a cathode. Applying a voltage between an anode and a cathode injects holes and electrons into the organic light-emitting layer from the anode and the cathode, respectively. The holes and the electrons recombine in the organic light-emitting layer to generate excitons, which emit light when transitioning from an excited state to a ground state.

The cathode electrode may have a low work function so that it may easily inject electrons into the organic light-emitting layer. For example, magnesium, which has a work function of 3.46 eV, can be used to form the cathode. However, magnesium may react with external oxygen or moisture, making it difficult to implement a stable organic electroluminescence device.

U.S. Pat. No. 4,885,211 discloses an organic electroluminescence device with a cathode including a magnesium—silver (Mg—Ag) alloy to solve the above-mentioned problem. As a result, an organic electroluminescence device having a long lifespan can be obtained. However, since the cathode may comprise Mg having a thickness of 2,000 Å and Ag having a thickness of 250 Å or less, its overall thickness may deteriorate light transmittance. Therefore, such a structure may not be applied to a top-emission light-emitting structure, but only to a bottom-emission light-emitting structure.

In order to solve such a restriction, U.S. Pat. Nos. 6,030,700, 6,075,316, 6,548,956, and 6,596,134 disclose a cathode including a thin Mg—Ag layer and a transparent conductive oxide (TCO) layer made of ITO, IZO, etc. is formed on the Mg—Ag layer to reduce the cathode's resistance. However, in the above-mentioned patents, when the Mg—Ag layer is 100 Å or less thick, the cathode is formed in a shape of an island, and when the Mg—Ag layer is greater than 200 Å thick, the light transmittance deteriorates. Therefore, it may not be feasible to use such organic electroluminescence devices in a top-emission light-emitting structure. Additionally, the TCO layer is formed on the cathode. Accordingly, when the TCO layer is formed using a sputtering method, dark spots 1 and leakage current 2 may be generated due to sputter damage, as shown in FIG. 1 and FIG. 2.

SUMMARY OF THE INVENTION

The present invention provides an organic electroluminescence device that may have excellent color purity, reduced power consumption, and excellent light transmittance and efficiency, without forming a TCO layer, by using an Mg—Ag layer having an optimum thickness as a cathode, and a method of manufacturing the organic electroluminescence device.

Additional features of the invention will be set forth in the description which follows, and in part will be apparent from the description, or may be learned by practice of the invention.

The present invention discloses an organic electroluminescence device including a substrate, a first electrode formed on the substrate, an organic layer formed on the first electrode and including at least an organic light-emitting layer, and a second electrode formed on the organic layer. The second electrode is made of an Mg—Ag layer having a thickness in a range of 170 Å to 200 Å.

The present invention also discloses an organic electroluminescence device including a substrate, a first electrode formed on the substrate, an organic layer formed on the first electrode and including at least an organic light-emitting layer, and a second electrode formed on the organic layer. The second electrode is made of an Mg—Ag layer having a light transmittance in a range of 20% to 35%.

The present invention also discloses a method of manufacturing an organic electroluminescence device, including forming a first electrode on a substrate, forming on the first electrode an organic layer including at least an organic light-emitting layer, and forming on the organic layer a second electrode made of an Mg—Ag layer having a thickness in a range of 170 Å to 200 Å.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 3 is a cross-sectional view showing an organic electroluminescence device according to a first exemplary embodiment of the present invention.

FIG. 4 is a cross-sectional view showing an organic electroluminescence device according to a second exemplary embodiment of the present invention.

DETAILED DESCRIPTION OF THE ILLUSTRATED EMBODIMENTS

Figure 1:
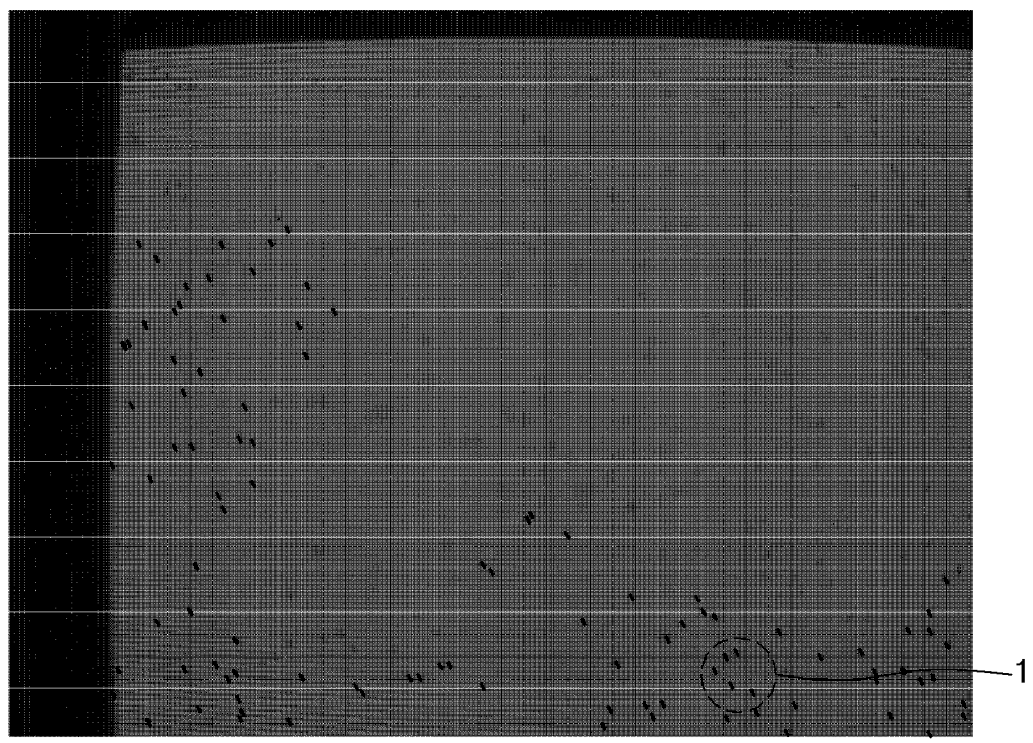
FIG. 1 is a photograph showing dark spots on cathode electrodes resulting from sputter damage.
Figure 2:
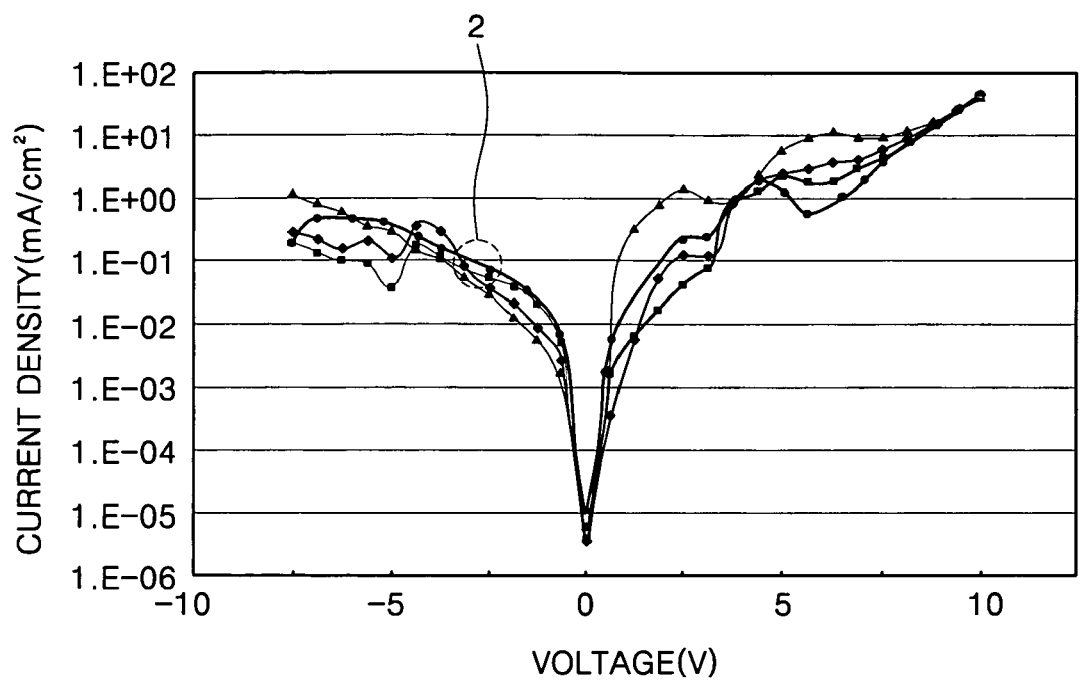
FIG. 2 is a graph showing generation of leakage current due to the sputter damage.

Now, exemplary embodiments of the present invention will be described in detail with reference to the accompanying drawings.

FIG. 3 is a cross-sectional view showing an organic electroluminescence device according to a first exemplary embodiment of the present invention.

Referring to FIG. 3, a plurality of first electrodes 12 may be provided on a substrate 10 by depositing and patterning a first electrode forming material. The first electrode 12 may serve as an anode or a cathode. The substrate 10 may comprise one or more thin film transistors (not shown) that are coupled to the first electrode 12. A pixel defining layer 14, which is made of an insulating material, may be formed on edges of each first electrode 12.

The first electrode 12 may be a transparent electrode or a reflective electrode. When the first electrode 12 is a transparent electrode, it may be made of, for example, an indium tin oxide (ITO) film, an indium zinc oxide (IZO) film, a tin oxide (TO) film, or a zinc oxide (ZO) film. On the other hand, when the first electrode 12 is a reflective electrode, it may be made of, for example, a silver (Ag), an aluminum (Al), a nickel (Ni), a platinum (Pt), or a palladium (Pd), or an alloy thereof, and a transparent oxide film made of ITO, IZO, TO, or ZnO may be stacked on the alloy.

The first electrode 12 can be formed using a vapor phase deposition method such as, for example, a sputtering method and an evaporation method, an ion beam deposition method, an electron beam deposition method, or a laser ablation method.

An organic layer 16 including at least an organic light-emitting layer may be patterned and formed on the first electrode 12. The organic layer 16 may further include a hole injecting layer (HIL) and a hole transport layer (HTL) between the organic light-emitting layer and the first electrode 12. The HIL may be made of a small molecular weight material such as, for example, CuPc (copper phthalocyanine), TNATA, TCTA, TDAPB, and TDATA (4,4',4"-Tris(N,N'-diphenyl-amino)-triphenylamine), or a high molecular weight material such as, for example, PANI (polyaniline) and PEDOT (poly(3,4)-ethylenedioxythiophene). The HTL may be made of a small molecular weight material such as, for example, α-NPB (N,N'-Bis(naphthalene-1-yl)-N,N'-bis(phenyl)benzidine), TPD (N,N'-Bis-(3-methylphenyl)-N,N'-bis-(phenyl)-benzidine), s-TAD, and MTDATA (4,4',4"-Tris(N-3-methylphenyl-N-phenyl-amino)-triphenylamine, or a high molecular weight material such as, for example, PVK. The HIL and the HTL can be formed using, for example, a vapor phase deposition method, a spin coating method, an inkjet printing method, or a laser thermal transfer method.

The organic light-emitting layer may be made of a phosphorescent or fluorescent material. When the organic light-emitting layer is made of a fluorescent material, it may include distyrylarylene (DSA), DSA derivatives, distyrylbenzene (DSB), DSB derivatives, DPVBi (4,4'-bis-(2,2'-diphenylvinyl)-1,1'-biphenyl), DPVBi derivatives, spiro-DPVBi, or spiro-6P (spiro-sixphenyl). The organic light-emitting layer may further include a dopant material such as a styrylamine material, a phenylene material, or a distyrylbiphenyl (DSBP) material.

On the other hand, when the organic light-emitting layer is made of a phosphorescent material, it may include an arylamine material, a carbazole material, or a spiro material as a host material. Preferably, the host material is CBP (4,4'-N,N dicarbazole-biphenyl), CBP derivatives, mCP (N,N-dicarbazolyl-3,5-benzene), mCP derivatives, or spiro derivatives. The organic light-emitting layer may include a phosphorescent organic metal complex having a central metal comprised of Ir, Pt, Th, or Eu, as a dopant material. The phosphorescent organic metal complex may be PQIr, PQIr(acac), PQIr(acac), $PQ_2Ir(acac)$, or PtOEP.

The organic light-emitting layer may be formed using, for example, a vacuum deposition method, an inkjet printing method, or a laser thermal transfer method.

The organic layer 16 may further include a hole blocking layer (HBL), an electron transport layer (ETL), and/or an electron injecting layer (EIL) between the organic light-emitting layer and a second electrode 18.

When the organic light-emitting layer is made of a fluorescent material, the HBL is typically not formed. Holes transferred from the first electrode 12 may recombine with the electrons in the organic light-emitting layer, thereby forming excitons. However, since the transfer speed of holes is greater than the transfer speed of electrons, holes may pass through the organic light-emitting layer and diffuse into the ETL and the EIL. The HBL serves to prevent the diffusion of holes and the diffusion of excitons generated in the organic light-emitting layer. Specifically, when the organic light-emitting layer is made of a phosphorescent material, the transfer speed of holes increases. Therefore, in the case of a phosphorescent device employing a phosphorescent material, the HBL may be necessary. The HBL may be made of, for example, BAlq, BCP, CF-X, TAZ, or spiro-TAZ.

The ETL may be made of a high molecular weight material such as, for example, PBD, TAZ, and spiro-PBD or a small molecular weight material such as, for example, $Alq_3$, BAlq, and SAlq. The EIL may be made of a material such as, for example, $Alq_3$ (tris(8-quinolinolato)aluminum), LiF (Lithium Fluoride), gallium (Ga) complex, or PBD. The ETL and the EIL may be formed using, for example, a vacuum deposition method, a spin coating method, an inkjet printing method, or a laser thermal transfer method.

The second electrode 18 may be formed on the organic layer 16. The second electrode 18 can serve as an anode or a cathode. According to embodiments of the present invention, the second electrode 18 may serves as a cathode made of a magnesium-silver (Mg—Ag). The cathode 18 made of Mg—Ag may have an excellent electron injection characteristic. Further, providing an EIL, made out of alkali metal, or fluoride or oxide of alkali earth metal, between the cathode and the ETL, may enhance the cathode's electron injection ability.

In exemplary embodiments of the present invention, taking light efficiency into consideration, the cathode's thickness may be optimized to satisfy an optimal resonance condition. That is, the cathode is usually formed thick due to its process margin, but since a large thickness of the cathode decreases its light transmittance, it may not be possible to manufacture an efficient top-emitting organic electroluminescence device when the cathode is too thick.

According to embodiments of the present invention, when the wavelength of light is 550 nm and the light transmittance ranges from 20% to 35%, the organic electroluminescence device may have excellent characteristics in view of light efficiency and power consumption. Therefore, the thickness of the Mg—Ag layer may be optimized so as to have such light transmittance.

Accordingly, the thickness of the Mg—Ag layer, as the cathode, may range from 170 Å to 200 Å. When the Mg—Ag layer is less than 170 Å thick, the Mg—Ag layer may be formed as an island due to its small thickness, thereby deteriorating its electrical characteristic and the color coordinate characteristic. When the Mg—Ag layer is greater than 200 Å thick, light efficiency, light transmittance, power consumption, and lifespan may deteriorate.

Specifically, the thickness of the Mg—Ag layer may range from 180 Å to 200 Å. In this case, light transmittance may range from 20% to 35%, the value of Y for blue in the color coordinate system may be less than or equal to 0.20, which means that the color purity is excellent, and power consumption may be 300 mW or less. Therefore, light efficiency, the color coordinate characteristic, and lifespan may all be satisfactory.

When applying embodiments of the present invention to an organic electroluminescence display device having a top-emission light-emitting structure, the power consumption associated with the color coordinates and the light transmittance is specifically important.

That is, since power consumption depends upon color coordinates and light transmittance, power consumption may be calculated from the color coordinates and the light transmittance.

As described above, it is preferable that the color coordinate characteristic, that is, the color purity, is excellent and the power consumption is small. Additionally, the light transmittance may have a constant range for satisfactory light efficiency and power consumption. Therefore, the Mg—Ag layer with a thickness satisfying such conditions may be used as the cathode.

On the other hand, in order to prevent the voltage drop (IR drop) due to a sheet resistance of the cathode 18, the cathode's sheet resistance may be less than a predetermined value. The mixture ratio of Mg and Ag is an important factor for satisfying such a condition. According to embodiments of the present invention, when the atomic ratio of Mg and Ag is 25:1, the voltage drop may be suppressed. More preferably, the atomic ratio of Mg and Ag may be 10:1.

The Mg—Ag layer may be formed using, for example, a decomposition method.

In the first exemplary embodiment of the present invention, an organic electroluminescence device may be completed by sealing the device with a sealing substrate 22 including a sealant after forming the cathode 18. The sealant may be formed on the entire substrate. Reference numeral 20 denotes an empty space.

FIG. 4 is a cross-sectional view showing an organic electroluminescence device according to a second exemplary embodiment of the present invention.

The second exemplary embodiment has the same structure as the first exemplary embodiment, except that a passivation layer 20' is formed on the cathode 18 to prevent external air from damaging the cathode.

Referring to FIG. 4, the passivation layer 20' may be made of an organic material layer or an inorganic material layer. The passivation layer 20' may be made of one layer or multiple layers. The inorganic material layer may be, for example, a silicon oxide ($SiO_2$), a silicon nitride ($SiN_x$), and a silicon oxynitride ($SiO_xN_y$). Alternatively, the inorganic material layer may be an LiF. On the other hand, the organic material layer may be a layer containing at least one of NPB (N,N'-Bis(naphthalene-1-yl)-N,N'-bis(phenyl)benzidine), TNATA, TCTA, TDAPB, TDATA, $Alq_3$, BAlq, and CPB.

The passivation layer 20' may be formed using, for example, an evaporation method, a chemical vapor deposition (CVD) method, or a sputtering method. The passivation layer 20' may protect the organic layer 16 from external moisture or oxygen, thereby preventing deterioration of the device.

The passivation layer 20' may be transparent. Further, the refraction index of the passivation layer 20' may be higher than that of the cathode 18. Accordingly, when light emitted from the organic light-emitting layer passes through the cathode 18, the total reflection at the interface between the cathode 18 and the passivation layer 20' may be reduced, thereby enhancing light transmittance.

Thereafter, forming the sealing substrate 22 including a sealant on the passivation layer 20' may complete the organic electroluminescence device. In this case, the sealant may be formed on the entire substrate.

Hereinafter, exemplary experimental examples will be described to help understand the present invention. The following experimental examples are intended to help understand the present invention. Thus, they are not intended to limit the present invention.

EXPERIMENTAL EXAMPLES 1 TO 4

Manufacturing an Organic Electroluminescence Device

An anode having an area of 2 mm×2 mm is formed on a substrate out of ITO. Then, the anode is subjected to an ultrasonic cleaning process and a UV-$O_3$ process. Then, an HIL is formed by vacuum-depositing TDATA (4,4',4''-Tris (N,N'-diphenyl-amino)-triphenylamine) with a thickness of 300 Å on the anode. An HTL is formed by vacuum-depositing α-NPB (N,N'-Bis(naphthalene-1-yl)-N,N'-bis(phenyl)benzidine) with a thickness of 100 Å on the HIL. An organic light-emitting layer with a thickness of 200 Å is formed by co-depositing a dopant material such as distyrylarylene (DSA) and styrylamine on the HTL. An ETL is formed by stacking Balq with a thickness of 50 Å on the organic light-emitting layer and vacuum-depositing $Alq_3$ with a thickness of 250 Å thereon. A cathode is formed by co-depositing magnesium and silver on the ETL to form an Mg—Ag layer having an atomic ratio of 10:1 between magnesium and silver and a thickness of 170 Å. Thereafter, the substrate is sealed with a sealing substrate, thereby completing an organic electroluminescence device.

In Experimental examples 2, 3 and 4, organic electroluminescence devices are manufactured in the same structure as Experimental example 1, except that the cathodes are formed to have a thickness that increases from 180 Å to 200 Å by 10 Å, respectively.

Comparative Examples 1 to 11

In Comparative example 1, an organic electroluminescence device is manufactured using the same method as Experimental example 1, except that the cathode is formed with a 100 Å thick Mg—Ag layer by co-depositing magnesium and silver.

In Comparative examples 2 to 11, organic electroluminescence devices are manufactured in the same structure as Comparative example 1, except that the cathodes are formed to have a thickness that increases from 110 Å to 160 Å by 10 Å and from 210 Å to 240 Å by 10 Å.

(1) Measurement of Light Emission Efficiency

In driving the organic electroluminescence devices, the anodes are supplied with a positive voltage and the cathodes are grounded. Then, a photometer may be used to measure the devices' emission brightness. The emission brightness of the organic electroluminescence devices with a driving voltage of 6V is measured for Experimental examples 1 to 4 and Comparative examples 1 to 11.

(2) Measurement of Color Coordinates

Color coordinates of the organic electroluminescence devices are measured with a color analyzer.

(3) Measurement of Transmittance and high-temperature lifespan

Transmittance of the organic electroluminescence devices is measured when the light emission wavelength ranges from 380 nm to 780 nm. When the organic electroluminescence devices are driven with an initial brightness of 3,000 cd/m$^2$, degrees of a decrease in brightness are measured with respect to the driving time. The lifespans of the devices are measured using the driving time required until the degrees of decrease in brightness reach 40%.

Figure 5:
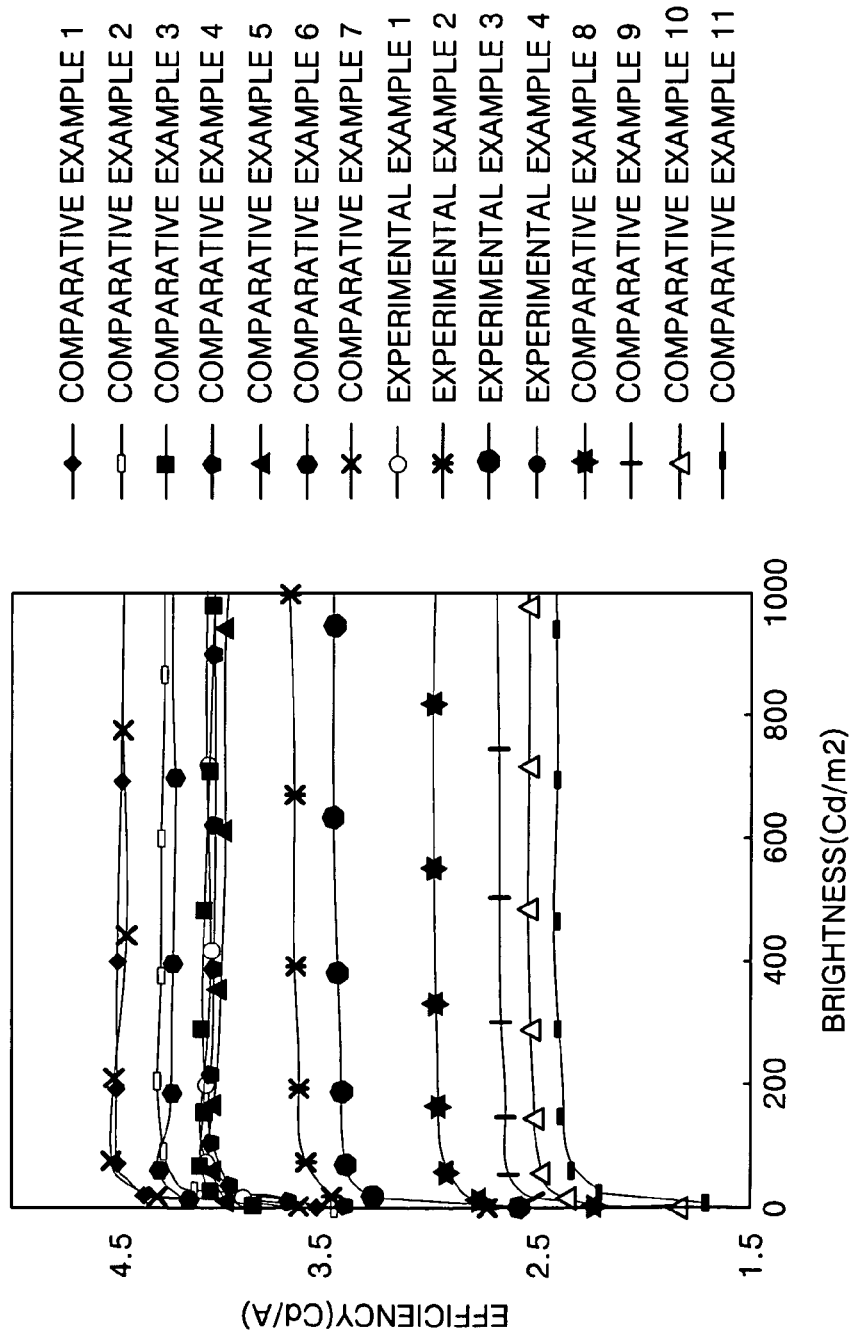
FIG. 5 is a graph showing light efficiency in experimental examples of the present invention and comparative examples.
Figure 6:
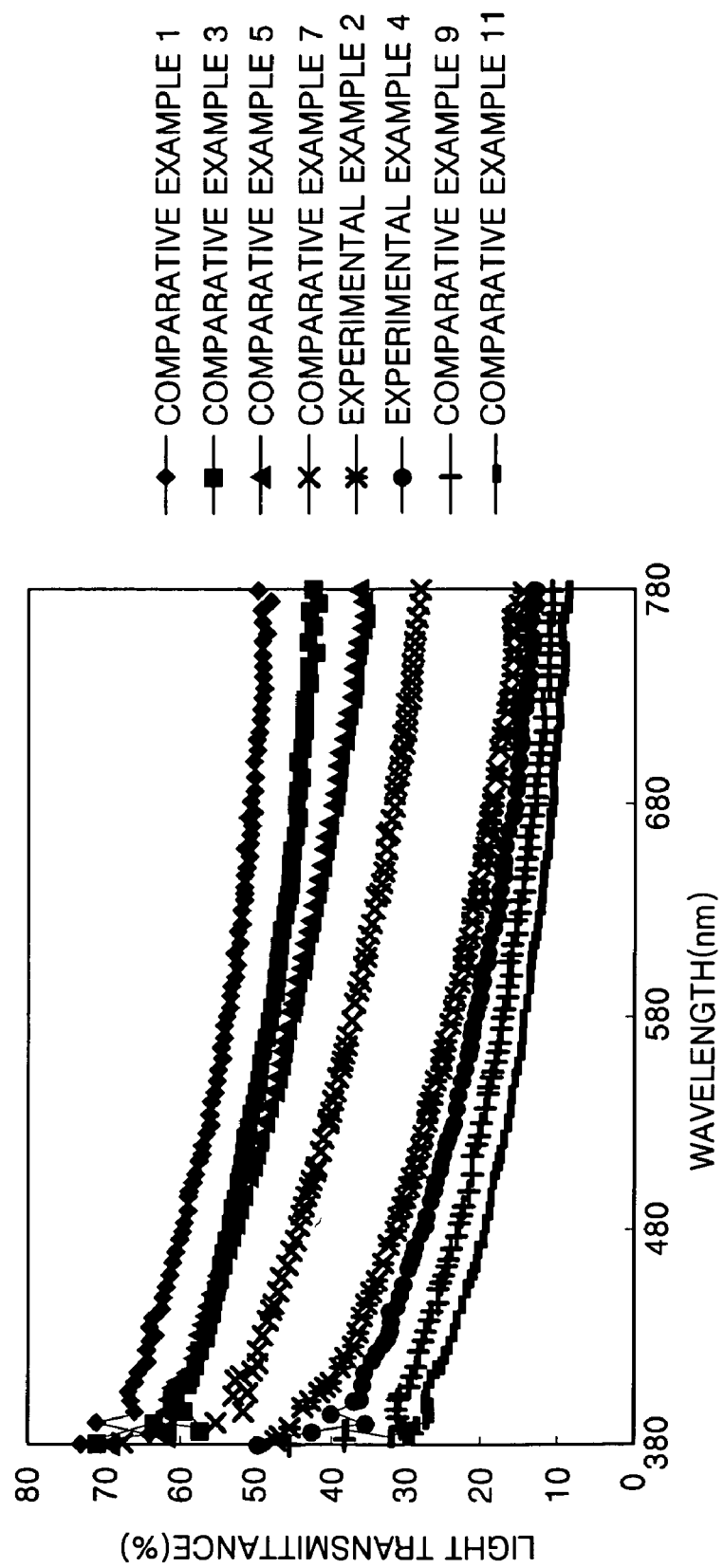
FIG. 6 is a graph showing light transmittance in the experimental examples of the present invention and the comparative examples.
Figure 7:
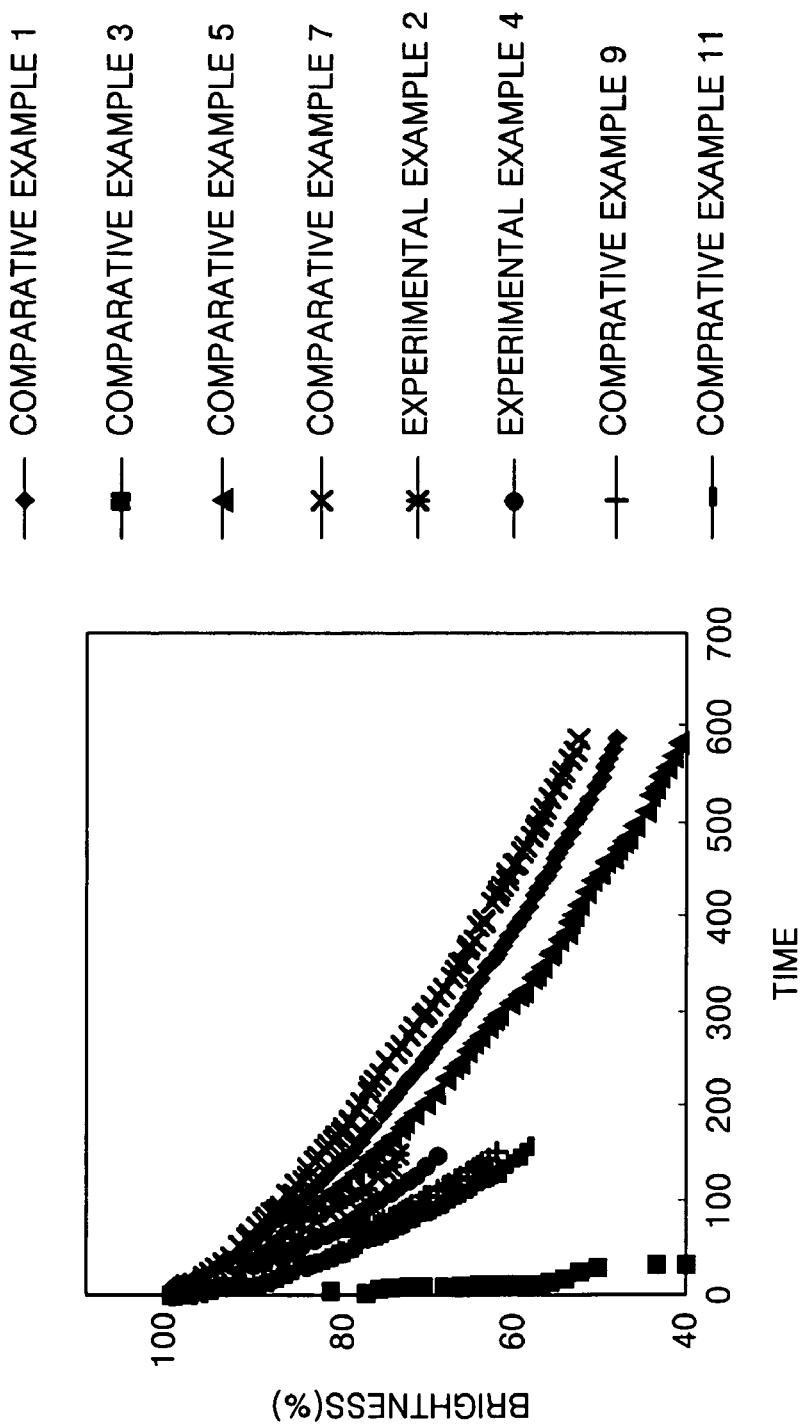
FIG. 7 is a graph showing lifespan in the experimental examples of the present invention and the comparative examples.

Table 1 and FIG. 5, FIG. 6 and FIG. 7 show the measurement results of characteristics of the organic electroluminescence devices of Experimental examples 1 to 4 and Comparative examples 1 to 11.

TABLE 1

Error Range: ±5%

| | Light efficiency (Cd/A) @6 V | Color coordinates | Transmittance (%) | Lifespan (%) | Power consumption (mW) |
|---|---|---|---|---|---|
| Comparative example 1 | 4.48 | (0.16, 0.29) | 54.896 | 74.59 | 341.4 |
| Comparative example 2 | 4.50 | — | — | — | — |
| Comparative example 3 | 4.08 | (0.16, 0.28) | 48.793 | Exposed to O$_2$ | 353.0 |
| Comparative example 4 | 4.01 | — | — | — | — |
| Comparative example 5 | 4.01 | (0.15, 0.29) | 47.263 | 75.341 | 370.3 |
| Comparative example 6 | 3.72 | — | — | — | — |
| Comparative example 7 | 4.46 | (0.14, 0.31) | 39.027 | 81.092 | 365.6 |
| Experimental example 1 | 4.12 | — | — | — | — |
| Experimental example 2 | 3.67 | (0.12, 0.19) | 25.646 | 74.409 | 252.2 |
| Experimental example 3 | 3.37 | — | — | — | — |
| Experimental example 4 | 3.29 | (0.12, 0.176) | 22.46 | 68.701 | 254.7 |
| Comparative example 8 | 3.05 | — | — | — | — |
| Comparative example 9 | 2.69 | (0.12, 0.152) | 18.334 | 61.708 | 199.95 |
| Comparative example 10 | 2.50 | — | — | — | — |
| Comparative example 11 | 2.40 | (0.12, 0.147) | 15.162 | 57.714 | 272.5 |

First, referring to Table 1 and FIG. 5, in Experimental example 2 of the present invention, in which the cathode is 180 Å thick, the organic electroluminescence device has a color coordinate of (0.12, 0.19), light transmittance of 25.646%, and power consumption of 252.2 mW. Thus, these characteristics lie in a range allowing the device to be used as a display device. Additionally, while the light efficiency of 3.67 Cd/A is worse than those of Comparative examples 1 to 7, it lies within an acceptable range for a display device.

In Experimental example 4, in which the Mg—Ag layer is 200 Å thick, since the color coordinate is (0.12, 0.176), the value of Y for blue is less than 0.200. Thus, the color purity is excellent. Additionally, since power consumption is 254.7 mW and light transmittance is 22.46%, the organic electroluminescence device exhibits acceptable characteristics for a display device.

Experimental example 3 is smaller in the color coordinate than Experimental example 2, since the value of Y in the color coordinates decreases with an increasing thickness of the Mg—Ag layer, and is greater in light transmittance than Experimental example 4, since Table 1 shows that light transmittance decreases with increasing thickness. Consequently, the color coordinate characteristic and light transmittance of Experimental example 3 are satisfactory. Since Experimental examples 2 and 4 do not have a significant difference in power consumption, it can be expected that the same is true of Experimental example 3.

Table 1 and FIG. 5 also show that Experimental example 1 has increased light efficiency as compared to Experimental examples 2, 3 and 4.

On the other hand, in Comparative example 1, in which the Mg—Ag layer is 100 Å thick, the color coordinate is (0.16, 0.29). Therefore, since the color purity for blue is 0.200 or more, a satisfactory blue color may not be displayed. Additionally, the light transmittance of 54.896% and the power consumption of 341.4 mW are relatively high. In comparative examples 1 to 7, in which the thickness of the cathode increases from 100 Å to 160 Å by 10 Å, the value of Y in the color coordinates ranges 0.29 to 0.31, which is not desirable. Further, power consumption ranges from 341.4 to 370.3 mW, which is high, and light transmittance ranges from 39.027 to 54.896, which is also high. The high light transmittance may result in the high power consumption. As Table 1 shows, when the light transmittance is high, the power consumption is may also be high.

In the organic electroluminescence devices from Comparative example 8, in which the cathode is 210 Å thick, to Comparative example 11, in which the cathode is 240 Å thick, the color coordinates can be applied to a blue device and power consumption is 300 mW or less, which is satisfactory. However, since light transmittance may be less than 20%, which is low, light efficiency (3.05 to 2.40 Cd/A) of the organic electroluminescence devices having a front light-emitting structure is low, which is not desirable.

As described above, when the Mg—Ag layer is 180 Å thick, power consumption is satisfactory in view of the color coordinate relative to light efficiency. Therefore, the thickness in Experimental example 2 may be applied as the optimum thickness of the cathode according to embodiments of the present invention. When the color coordinate relative to light efficiency is satisfactory, the organic electroluminescence device may serve as a display device in view of power consumption.

Referring to Table 1 and FIG. 6, from the view point of light transmittance, when the transmittance of light having a wavelength of 550 nm is in a range of 20% to 35%, the organic electroluminescence device may be used as an organic electroluminescence device having a front light-emitting structure. Therefore, in Comparative examples 1, 3, 5, and 7, light transmittance is greater than 35% and the values of Y in the color coordinates may not be suitable for a blue color coordinate. In Comparative examples 9 and 11, in which the cathode is 220 Å thick or more, light transmittance is about 18% or less. Thus, the organic electroluminescence devices of Comparative examples 9 and 11 may not be suitable for a front light-emitting structure from the view point of power consumption. Additionally, since the light transmittance decreases proportionally to cathode thickness, it can be seen that in Comparative examples 2, 4, and 6, of which measured data are not shown in FIG. 6, that the light transmittance is about 45% or more and the color coordinates may not be suitable for the blue front light-emitting structure.

Referring to Table 1 and FIG. 7, it can be seen in Comparative examples 1, 5, and 7 that the brightness after 160 hours is 70% or more of the initial brightness, and it can also be seen in Experimental examples 2 and 4 that the brightness after 160 hours ranges from 68% to over 70% of the initial brightness. Therefore, it can be seen that Experimental examples 2 and 4 and Comparative examples 1 to 7 have acceptable brightness after 160 hours, that is, the lifespan. However, Comparative examples 9 and 11 have the lifespan characteristic of 61% or less, which is not good.

As described above, according to exemplary embodiments of the present invention, since the Mg—Ag layer having a definite composition and a predetermined thickness range is used as the cathode, characteristics such as light efficiency, light transmittance, lifespan, and color purity may be better than those in the case where the cathode has a different range of thickness. Additionally, since it is not necessary to form a transparent conductive oxide layer on the cathode, the cathode is not damaged due to sputter, which enhances the device's characteristics. Therefore, the present invention may be suitably applied to an organic electroluminescence device having a top-emission light-emitting structure.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescence device, comprising:
    a substrate;
    a first electrode formed on the substrate;
    an organic layer formed on the first electrode, the organic layer including at least an organic light-emitting layer; and
    a second electrode formed on the organic layer,
    wherein the second electrode is made of an Mg-Ag layer having a thickness in a range of 170Å to 200 Å, the atomic ratio of Mg to Ag being not greater than 25:1, and
    wherein a conductive oxide is not disposed directly on the second electrode,
    wherein a value of Y in the color coordinate system is 0.200 or less when the organic electroluminescence device emits blue light.

2. The organic electroluminescence device of claim 1, wherein the thickness of the second electrode is in a range of 180Å to 200 Å.

3. The organic electroluminescence device of claim 1, wherein the second electrode contains Mg and Ag in an atomic ratio of 10:1.

4. The organic electroluminescence device of claim 1, wherein the second electrode serves as a cathode electrode.

5. The organic electroluminescence device of claim 1, further comprising a passivation layer formed on the second electrode.

6. The organic electroluminescence device of claim 5, wherein the passivation layer is one of an organic material layer, an inorganic material layer, and a multilayer thereof.

7. The organic electroluminescence device of claim 6, wherein the inorganic material layer is one film selected from the group consisting of a silicon oxide film ($SiO_2$), a silicon nitride film ($SiN_x$), and a silicon oxynitride film ($SiO_xN_y$).

8. The organic electroluminescence device of claim 1, further comprising an LiF layer formed between the second electrode and the organic layer.

9. The organic electroluminescence device of claim 6, wherein the organic material layer is a layer containing at least one material selected from the group consisting of N,N'-Bis(naphthalene-1-yl)—N,N'-bis(phenyl)benzidine (NPB), TNATA, TCTA, TDAPB, 4,4',4"-Tris(N,N'-diphenyl-amino)-triphenylamine (TDATA), $Alq_3$, BAlq, and CPB.

10. The organic electroluminescence device of claim 1, wherein the organic layer further includes at least one of a hole blocking layer, an electron transport layer, and an electron injecting layer formed between the second electrode and the organic light-emitting layer.

11. The organic electroluminescence device of claim 1, wherein the organic layer further includes at least one of a hole injecting layer and a hole transport layer formed between the first electrode and the organic light-emitting layer.

12. An organic electroluminescence device, comprising:
    a substrate;
    a first electrode formed on the substrate;
    an organic layer formed on the first electrode, the organic layer including at least an organic light-emitting layer; and
    a second electrode formed on the organic layer,
    wherein the second electrode is made of an Mg-Ag layer,
    wherein a thickness of the Mg-Ag layer is in a range of 170 Å to 200 Å,
    wherein a conductive oxide is not disposed directly on the second electrode, and
    wherein the organic electroluminescence device has a light transmittance in a range of 20% to 35%.

13. The organic electroluminescence device of claim 12, wherein the thickness of the Mg-Ag layer is in a range of 180 Å to 200 Å.

14. The organic electroluminescence device of claim 12, wherein the Mg-Ag layer has an atomic ratio of Mg to Ag not greater than 25:1.

15. The organic electroluminescence device of claim 14, wherein the Mg-Ag layer has an atomic ratio of Mg to Ag of 10:1.

16. The organic electroluminescence device of claim 12, wherein the second electrode serves as a cathode electrode.

17. The organic electroluminescence device of claim 12, further comprising a passivation layer formed on the second electrode.

18. The organic electroluminescence device of claim 17, wherein the passivation layer is one of an organic material layer, an inorganic material layer, and a multilayer thereof.

19. The organic electroluminescence device of claim 18, wherein the inorganic material layer is one film selected from the group consisting of a silicon oxide ($SiO_2$) film, a silicon nitride ($SiN_x$) film, and a silicon oxynitride ($SiO_xN_y$) film.

20. The organic electroluminescence device of claim 12, further comprising an LiF layer formed between the second electrode and the organic layer.

21. The organic electroluminescence device of claim 18, wherein the organic material layer is a layer containing at least one material selected from the group consisting of N,N'-Bis(naphthalene-1-yl)—N,N'-bis(phenyl)benzidine (NPB), TNATA, TCTA, TDAPB, 4,4',4"-Tris(N,N'—diphenyl-amino)-triphenylamine (TDATA), $Alq_3$, BAlq, and CPB.

22. The organic electroluminescence device of claim 12, wherein the organic layer further includes at least one of a hole blocking layer, an electron transport layer, and an electron injecting layer formed between the second electrode and the organic light-emitting layer.

23. The organic electroluminescence device of claim 12, wherein the organic layer further includes at least one of a hole injecting layer and a hole transport layer formed between the first electrode and the organic light-emitting layer.

24. The organic electroluminescence device of claim 12, wherein when the organic electroluminescence device emits blue light, a value of Y in the color coordinate system is 0.200 or less.

25. A method of manufacturing an organic electroluminescence device, comprising:
   forming a first electrode on a substrate;
   forming on the first electrode an organic layer including at least an organic light-emitting layer; and
   forming on the organic layer a second electrode made of an Mg-Ag layer having a thickness in a range of 170Å to 200 Å,
   wherein a conductive oxide is not formed directly on the second electrode, and
   wherein the organic electroluminescence device has a light transmittance in a range of 20% to 35%.

26. The method of claim 25, wherein forming the second electrode comprises co-depositing Mg and Ag.

* * * * *